(12) United States Patent
Son

(10) Patent No.: US 8,087,652 B2
(45) Date of Patent: Jan. 3, 2012

(54) SUBSTRATE SUPPORTING APPARATUS

(75) Inventor: Suk Min Son, Daejeon (KR)

(73) Assignee: Advanced Display Process Engineering Co., Ltd, Seongnam-Si (KR)

( * ) Notice: Subject to any disclaimer, the term of this patent is extended or adjusted under 35 U.S.C. 154(b) by 615 days.

(21) Appl. No.: 12/188,453

(22) Filed: Aug. 8, 2008

(65) Prior Publication Data

US 2009/0042324 A1 Feb. 12, 2009

(30) Foreign Application Priority Data

Aug. 8, 2007 (KR) ........................ 10-2007-0079562

(51) Int. Cl.
*B23P 19/00* (2006.01)

(52) U.S. Cl. .................... 269/903; 269/266; 269/329

(58) Field of Classification Search ................. 269/903, 269/289 R, 302.1, 266, 329
See application file for complete search history.

(56) References Cited

U.S. PATENT DOCUMENTS

| | | | | |
|---|---|---|---|---|
| 2,110,822 A | * | 3/1938 | Roberts | 139/33 |
| 2,547,250 A | * | 4/1951 | Bennett | 28/151 |
| 4,045,061 A | * | 8/1977 | Fierro | 289/16.5 |
| 4,046,171 A | * | 9/1977 | Wilson | 139/29 |
| 5,054,181 A | * | 10/1991 | Nagasawa | 29/281.1 |
| 5,735,967 A | * | 4/1998 | Yakou et al. | 136/256 |
| 6,131,793 A | * | 10/2000 | Howell | 228/9 |
| 2006/0244190 A1 | * | 11/2006 | Erdmann | 269/266 |
| 2009/0042324 A1 | * | 2/2009 | Son | 438/17 |

FOREIGN PATENT DOCUMENTS

| | | |
|---|---|---|
| KR | 10-2004-0078795 | 9/2004 |
| KR | 10-2005-0076609 | 7/2005 |
| KR | CN1648725 | 8/2005 |

* cited by examiner

*Primary Examiner* — Lee D Wilson

(74) *Attorney, Agent, or Firm* — Ked & Associates LLP

(57) ABSTRACT

A substrate supporting apparatus includes first and second shafts spaced by a distance that corresponds to or exceeds a width of a substrate, and at least one wire to support the substrate. The wire has ends coupled to respective ones of the first and second shafts. The wire is raised and lowered to place a substrate onto a lower electrode in a substrate processing chamber and to remove the substrate when processing is completed.

20 Claims, 6 Drawing Sheets

Related Art

SUBSTRATE SUPPORTING APPARATUS

BACKGROUND

1. Field

One or more embodiments described herein relate to processing substrates including semiconductor substrates.

2. Background

Semiconductor devices and flat panel displays are made by performing photographing, etching, diffusion, deposition, and other processes on a substrate. These processes are performed in an apparatus having moving parts that can damage or otherwise adversely affect the performance of the finished substrate.

DETAILED DESCRIPTION

Figure 1A:
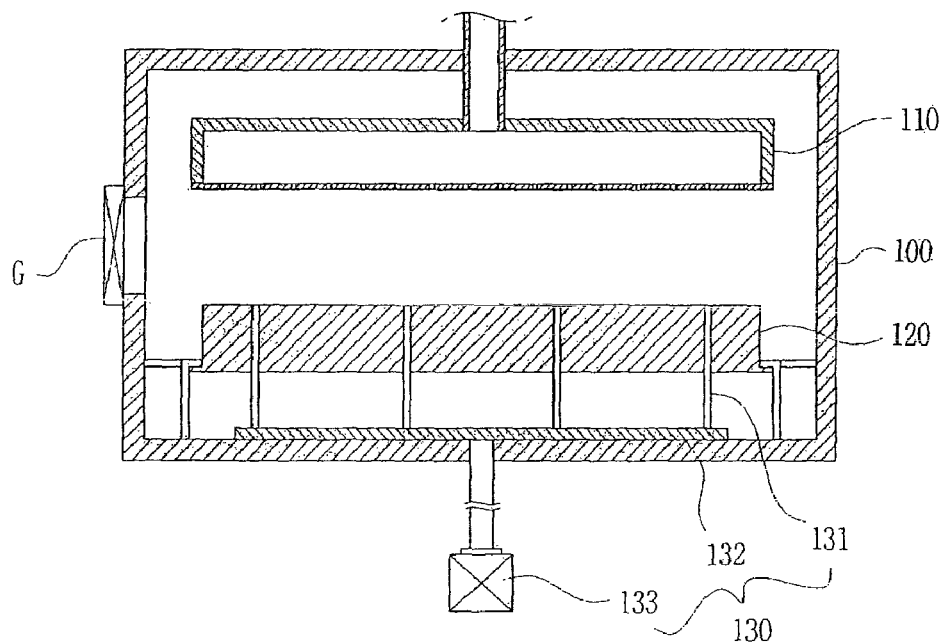
FIGS. 1a to 1c are diagrams showing one type of substrate supporting apparatus.

FIG. 1a shows one type of substrate processing apparatus that includes upper and lower electrodes 110 and 120 in a chamber 100. In operation, a substrate is transferred (e.g., by a robot) into the chamber through a gate valve G and placed on the lower electrode. A supporting apparatus 130 is used to place the substrate on the lower electrode, and/or to withdraw the substrate from the chamber once processing is finished.

The substrate supporting apparatus includes a plurality of lift pins 131 that pass through the lower electrode, a pin plate 132 provided with the lift pins, and a lift unit 133 for lifting the pin plate up and down.

Figure 1B:
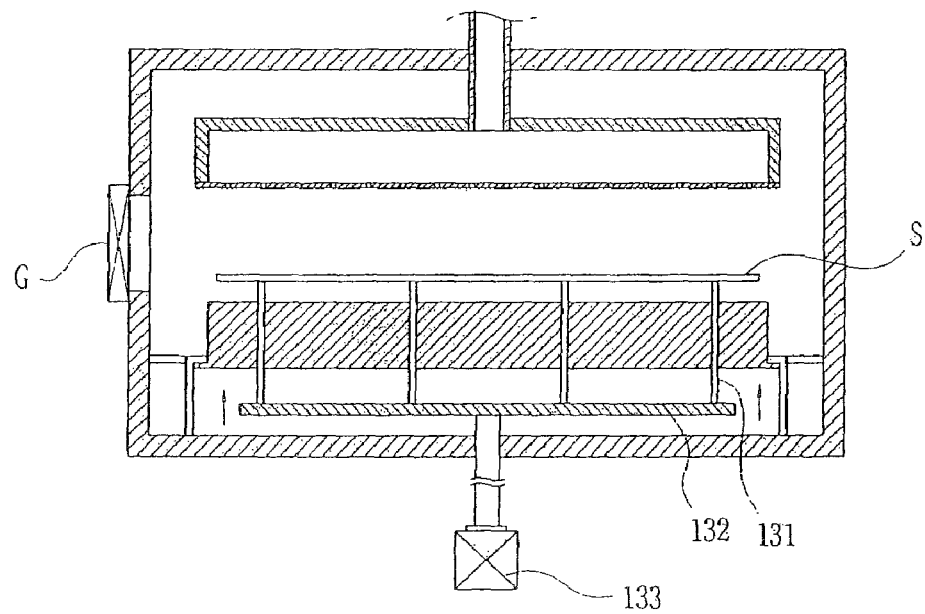
Figure 1C:
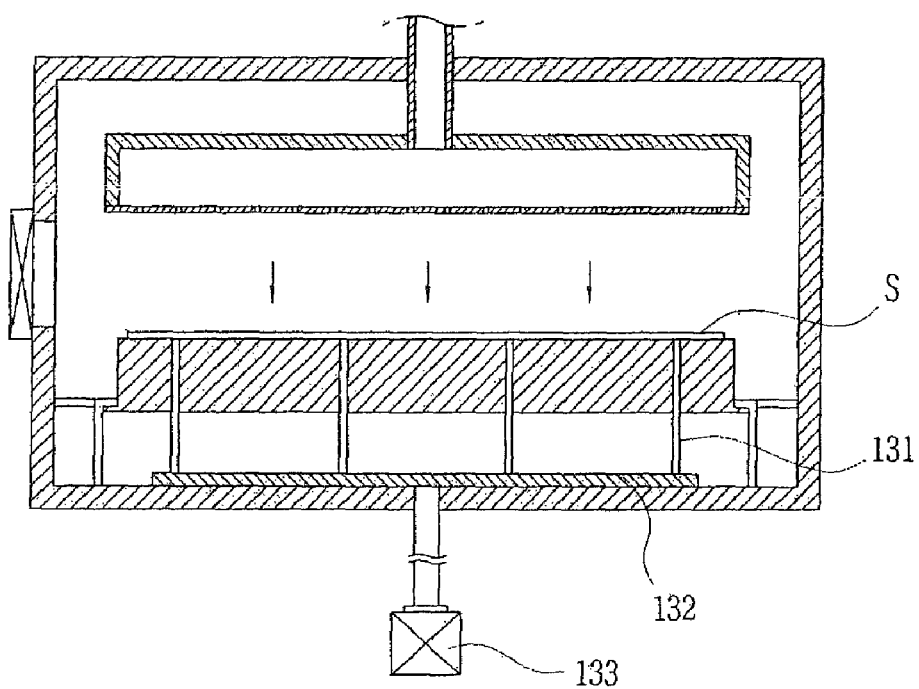

When gate valve G is opened in a state shown in FIG. 1a, a robot arm carrying the substrate is advanced into the chamber through the gate valve. As shown in FIG. 1b, when the robot arm advances into the chamber, pin plate 132 is immediately lifted causing lift pins 131 to pass through lower electrode. When the lift pins project out of the lower electrode, substrate S carried is transferred onto the lift pins from the robot. When the pin plate is lowered, the lift pins pass back through the lower electrode to thereby place the substrate on the lower electrode as shown in FIG. 1c.

When the lift pins contact the substrate during lifting and lowering, foreign materials attached to uppermost parts of the pins may cause spots to form on the substrate. Also, the positions of the lift pins are fixed and cannot be changed because, in any other position, the pins would not be able to pass through the respective holes in the lower electrode. Also, lift pins may damage patterns formed on the substrate, and further damage may result when processes are performed without first detecting that one or more of the lift pins are broken.

Figure 2:
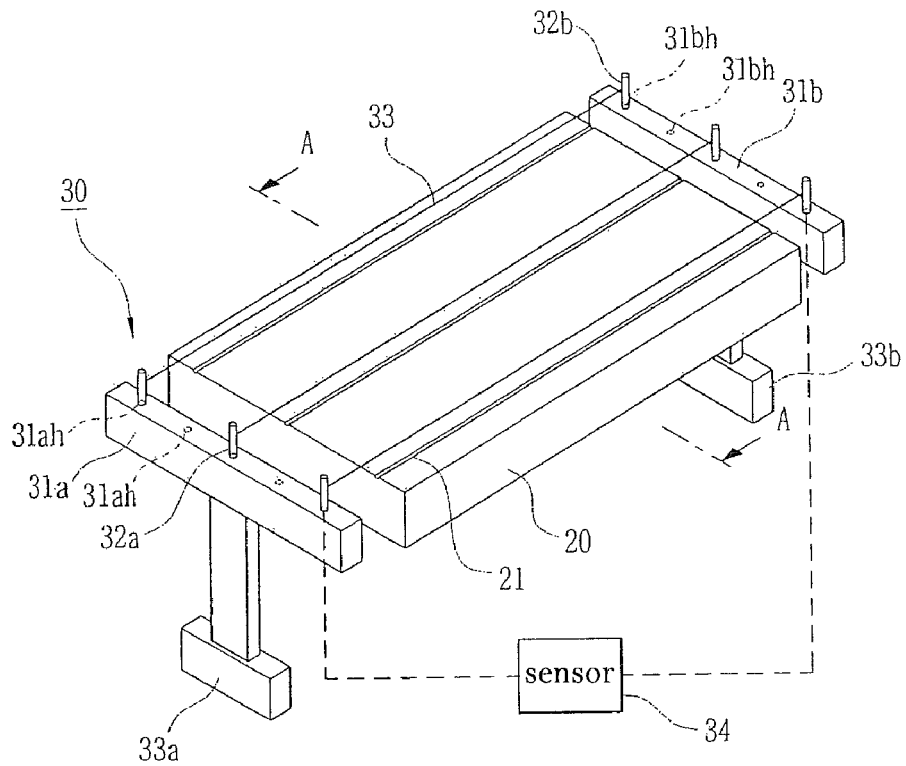
FIGS. 2 to 4 are diagrams showing an embodiment of another type of substrate supporting apparatus.
Figure 3:
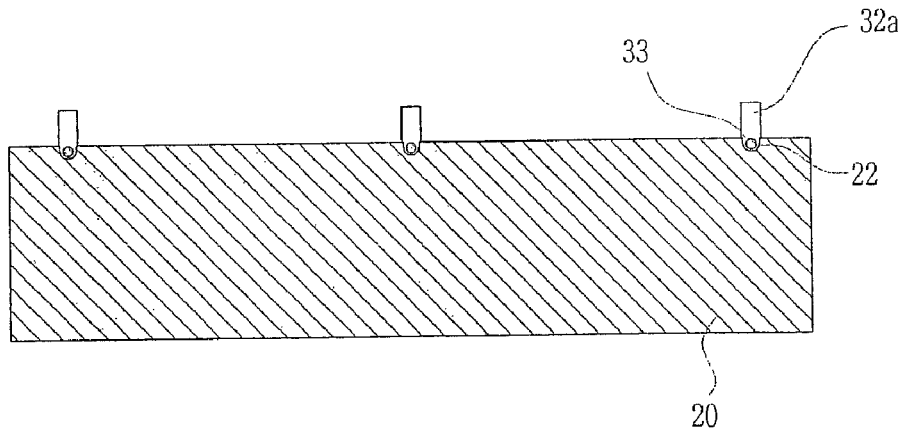

FIGS. 2 and 3 show an embodiment of another type of substrate supporting apparatus 30. This apparatus includes first and second supporters 31a and 31b provided in parallel at respective sides of lower electrode 20. The lower electrode is interposed between the first and second supporters and first and second combining holes 31ah and 31bh are formed on the first and second supporters respectively.

First shafts 32a are inserted into three of the combining holes 31ah, and second shafts 32b are inserted into three of the combining holes 31bh. This insertion may be performed, for example, by screwing the shafts into the holes. Wires 33 are connected to respective pairs of the shafts 32a and 32b that face each other. In FIG. 3, three wires are shown as being used. However, a different number of wires (e.g., 1 or more) may be used in other embodiments. Also, the gap or spacing between the wires may be determined, for example, based on the positions of the combining holes.

The position of the wires can be set or changed based on (e.g., to correspond to or avoid) patterns formed on the substrate. By setting or changing the position of the wires, it is possible, for example, to prevent the wires from contacting and therefore damaging portions of the substrate that contain patterns.

The substrate supporting apparatus also includes lift units 33a and 33b which are respectively connected to lower ends of first and second supporters 31a and 31b. The lift units operate to lift the first and second supporters 31a and 31b up and down as necessary before, during, and/or after processing.

The substrate supporting apparatus may also include a sensor 34 to detect the presence of a break in one or more of the wires. The sensor may detect a break (or short) by applying a signal (e.g., a current, voltage, or power signal) to one end of the wire and then detecting the presence or absence of the signal at an opposing end of the wire. Other types of sensors may be used for this purpose. An unexplained reference numeral '50' indicates a substrate transfer robot.

Figure 4:
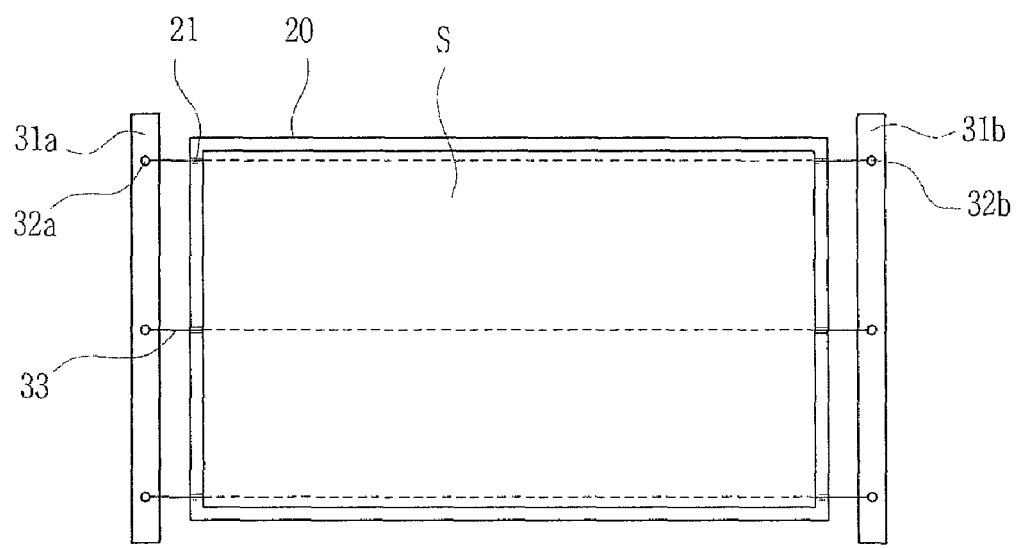

Referring to FIG. 4, one or more grooves 22 are formed on an upper surface of the lower electrode 20 to receive respective ones of the wires 33, when frames 31a and 31b are lifted down. In other embodiments, these grooves may not be formed.

Figure 5:
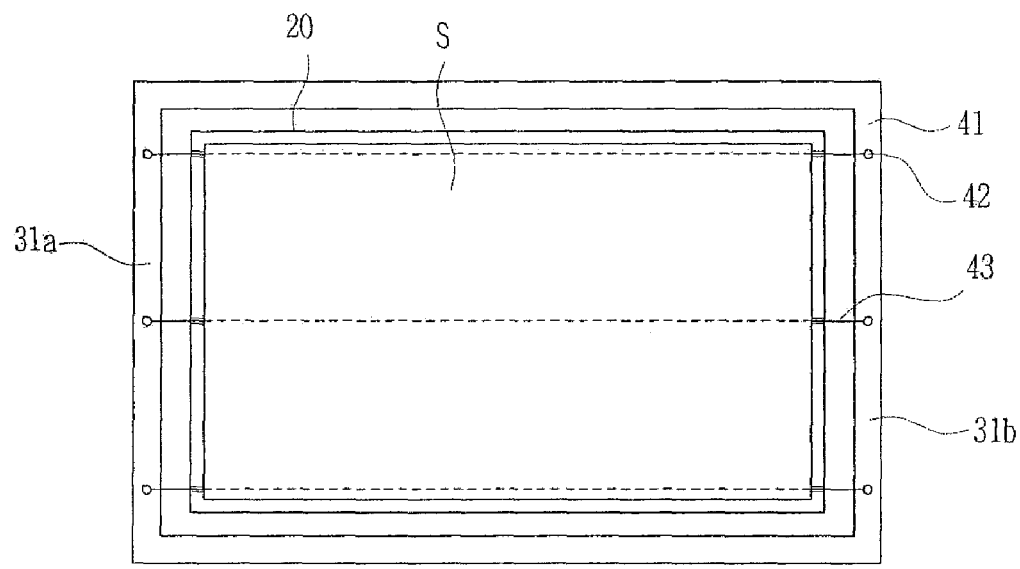
FIG. 5 is a diagram showing an embodiment of another type of substrate supporting apparatus.

FIG. 5 shows an embodiment of another type of substrate supporting apparatus. In this embodiment, supporters 31a and 31b are connected to each other. That is, the supporters in FIG. 3 correspond to a pair of bars but the supporters in FIG. 5 are connected to form a frame 41. This frame may be a rectangular ring-type frame that surrounds the lower electrode. The construction and operation of shaft 42 and wires 43 may be similar to those in FIG. 3.

Figure 6A:
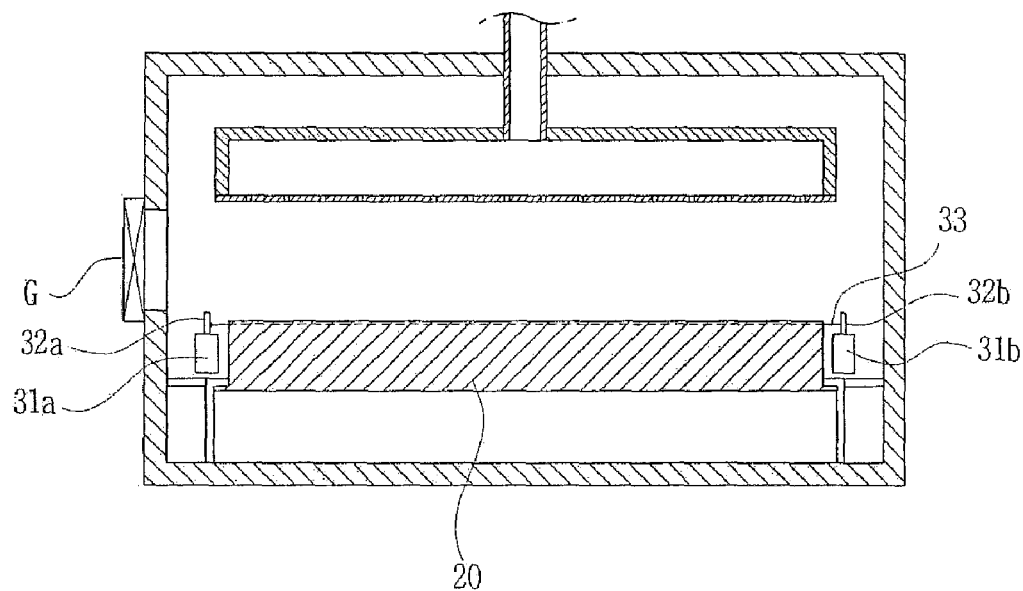
FIGS. 6a to 6c are diagrams showing operation of one or more of the foregoing embodiments of the substrate supporting apparatus.
Figure 6B:
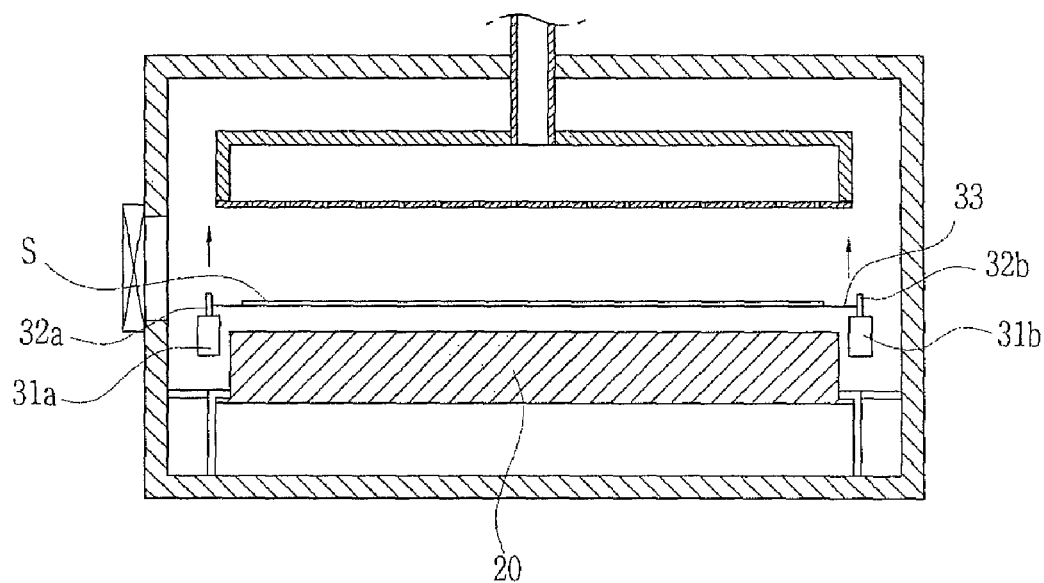
Figure 6C:
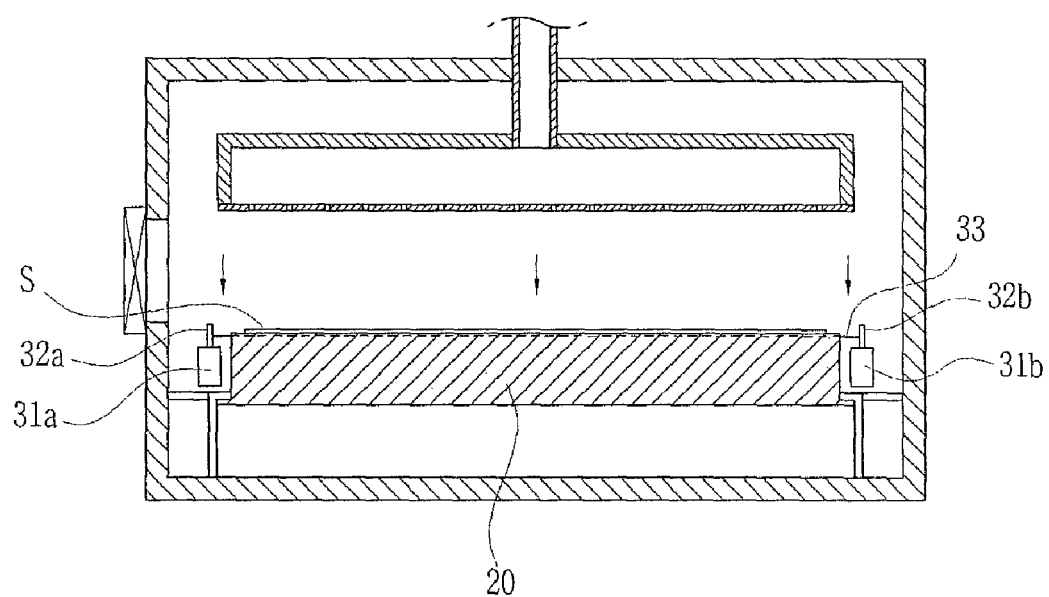

Operation of the substrate supporting apparatus will now be explained with reference to FIGS. 6a to 6c. First, as shown in FIG. 6a when a gate valve G is opened and a robot arm carrying a substrate S is advanced through the valve, the first and second supporters 31a and 31b are lifted up by the lift units. As a result, the substrate is removed from the robot arm to rest on the wires 33 as shown in FIG. 6b.

Next, the robot arm is withdrawn through the gate valve and the first and second supporters are lowered. When the supporters are lowered, the wires are received in respective grooves formed in lower electrode 20 and substrate S is placed on the lower electrode as shown in FIG. 6c.

Thus, one or more embodiments described herein provide a substrate supporting apparatus than can prevent spots from forming on contact portions of a substrate by using one or more wires to lift the substrate instead of lift pins.

According to one embodiment, a substrate supporting apparatus includes a pair of frames provided at both sides of a lower electrode, where the lower electrode is interposed between the frames; a plurality of shafts projected from upper surfaces of the frames; a wire whose both ends are connected to the shafts provided at both sides of the lower electrode; and a lift unit lifting up/down the frames.

A groove may be formed in an upper surface of the lower electrode to receive the wire when the frame is lifted down. The shaft may be formed integrally with the frame. Or, the shaft may be formed separately from the frame so as to be movably combined to the frame. The wire may be formed of conductor. Or, the wire may be formed of non-conductor and coated with conductor such as aluminum.

In addition, the substrate supporting apparatus may further include a sensor sensing a short of the wire to interrupt process when the wire is shorted. Both facing ends of the pair of frames may be connected with each other in a rectangular shape.

The foregoing embodiments of the substrate supporting apparatus can achieve one or more of following effects. First, the substrate is lifted using one or more wires. This prevents formation of spots on the substrate including areas that include patterns. Second, the positions of the wires can be set or changed (e.g., by moving shafts to different holes) to positions that avoid patterns on the substrate to thereby ensure that these portions of the substrate are not damaged. Third, the manufacturing process can be interrupted by quickly sensing a break (or short) in any one of the wires.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments of the present invention have been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A substrate supporting apparatus, comprising:
first and second shafts spaced by a distance that corresponds to or exceeds a width of a substrate;
at least one wire to support the substrate, said wire having ends that are coupled to respective ones of the first and second shafts and wherein the at least one wire contacts the substrate to support the substrate; and
a lifter to lift the first and second shafts up and down.

2. A substrate supporting apparatus, comprising:
first and second shafts spaced by a distance that corresponds to or exceeds a width of a substrate;
at least one wire to support the substrate, said wire having ends that are coupled to respective ones of the first and second shafts and wherein the at least one wire contacts the substrate to support the substrate;
a lower electrode below the wire; and
first and second supporters at least substantially in parallel with each other at respective sides of the lower electrode, wherein the first and second shafts are provided at the first and second supporters respectively.

3. A substrate supporting apparatus, comprising:
first and second shafts spaced by a distance that corresponds to or exceeds a width of a substrate;
at least one wire to support the substrate, said wire having ends that are coupled to respective ones of the first and second shafts and wherein the at least one wire contacts the substrate to support the substrate;
a lower electrode below the wire; and
a frame provided around the lower electrode, where the first and second shafts are provided at respective facing edges of the frame.

4. The apparatus of claim 3, wherein the frame is substantially rectangular in shape.

5. A substrate supporting apparatus, comprising:
first and second shafts spaced by a distance that corresponds to or exceeds a width of a substrate;
at least one wire to support the substrate, said wire having ends that are coupled to respective ones of the first and second shafts and wherein the at least one wire contacts the substrate to support the substrate;
a lower electrode below the wire; and
first and second supporters at least substantially in parallel with each other at respective sides of the lower electrode, the first and second supporters having a plurality of first and second combining holes respectively, wherein the first shaft is inserted into any one of the first combining holes and the second shaft is inserted into any one of the second combining holes.

6. A substrate supporting apparatus, comprising:
first and second shafts spaced by a distance that corresponds to or exceeds a width of a substrate;
at least one wire to support the substrate, said wire having ends that are coupled to respective ones of the first and second shafts and wherein the at least one wire contacts the substrate to support the substrate; and
a lower electrode below the wire,
wherein the lower electrode includes a groove to receive the wire when the first and second shafts are lowered to lower the substrate onto a surface of the lower electrode.

7. The apparatus of claim 1, wherein an outer circumferential surface of the wire is a conductor.

8. A substrate supporting apparatus, comprising:
first and second shafts spaced by a distance that corresponds to or exceeds a width of a substrate;
at least one wire to support the substrate; and
a sensor to detect a defect in the wire, wherein the wire has ends coupled to respective ones of the first and second shafts and wherein the sensor detects the defect by applying a current at one end of the wire and detecting presence or absence of the current at a second end of the wire.

9. A substrate supporting apparatus, comprising:
first and second shafts spaced by a distance that corresponds to or exceeds a width of a substrate;
at least one wire to support the substrate, said wire having ends that are coupled to respective ones of the first and second shafts and wherein the at least one wire contacts the substrate to support the substrate;
a plurality of first shafts spaced from a plurality of second shafts; and
a plurality of wires to contact and support the substrate, the plurality of wires coupled between respective pairs of shafts, each pair including one of the first shafts in opposing relation to a one of the second shafts, wherein the first shafts are spaced from the second shafts by a distance that corresponds to or exceeds a width of a substrate.

10. The apparatus of claim 1, wherein the first and second shafts are at positions that cause the wire to avoid contact with a pattern on the substrate.

11. The apparatus of claim 10, where positions of the shafts are adjustable to cause the wire to avoid contact with the pattern on the substrate.

12. A method for supporting a substrate, comprising:
providing at least one wire having ends coupled to first and second shafts respectively, the first and second shafts spaced by a distance that corresponds to or exceeds a width of a substrate;
lifting the at least one wire to a predetermined location, wherein the substrate is supported by the at least one wire at the predetermined location and wherein the wire contacts the substrate to support the substrate; and
lowering the wire to place the substrate onto a surface of a lower electrode in a substrate processing apparatus.

13. The method of claim 12, wherein the wire retracts into a groove on the surface of the lower electrode to cause the substrate to be solely supported by the surface of the lower electrode.

14. The method of claim 12, further comprising:
setting positions of the first and second shafts to cause the at least one wire to avoid a pattern on a surface of the substrate.

15. The method of claim 14, further comprising:
changing the first and second shafts from first positions to second positions to avoid said pattern.

16. The method of claim 12, wherein a plurality of wires are coupled between respective pairs of first shafts and second shafts to support the substrate, said wires being substantially parallel to one another.

17. A method, comprising:
providing at least one wire having ends coupled to first and second shafts respectively, the first and second shafts spaced by a distance that corresponds to or exceeds a width of a substrate;
lifting the at least one wire to a predetermined location, wherein the substrate is supported by the at least one wire at the predetermined location and wherein the wire contacts the substrate to support the substrate; and
detecting a defect in the at least one wire by applying a current at one end of the wire and detecting presence or absence of the current at a second end of the wire.

18. The apparatus of claim 1, wherein the first and second shafts do not overlap the substrate.

19. The apparatus of claim 1, wherein the wire has a length that equals or exceeds the width of the substrate.

20. A substrate supporting apparatus, comprising:
first and second posts spaced by a distance that corresponds to or exceeds a width of a substrate;
at least one substrate supporter to support the substrate, the substrate supporter having end portions that are coupled to respective ones of the first and second posts, and
a lifter to lift the first and second posts up and down, wherein the substrate supporter is in line contact with the substrate when the substrate supporter is supporting the substrate.

* * * * *